United States Patent [19]

Wittlinger

[11] Patent Number: 4,672,327
[45] Date of Patent: Jun. 9, 1987

[54] SELF-BIASING FOR ENHANCEMENT-MODE FIELD EFFECT TRANSISTORS

[75] Inventor: Harold A. Wittlinger, Mercer County, N.J.

[73] Assignee: RCA Corporation, Somerville, N.J.

[21] Appl. No.: 837,954

[22] Filed: Mar. 10, 1986

[51] Int. Cl.⁴ .............................................. H03F 3/30
[52] U.S. Cl. ................................... 330/269; 330/273; 330/277; 330/296
[58] Field of Search .................. 330/10, 20, 7 A, 251, 330/136, 264, 269, 267, 268, 273, 274, 296, 277

[56] References Cited

U.S. PATENT DOCUMENTS 3,725,805  4/1973  Orne ..................................... 330/136

Primary Examiner—James B. Mullins
Attorney, Agent, or Firm—Henry I. Schanzer; Birgit E. Morris; Stanley C. Corwin

[57] ABSTRACT

Signals applied to the gate of an enhancement-mode field effect transistor by resistive coupling, via a dc-blocking capacitor, are self-biased. The self biasing is carried out by detecting the signal amplitude and applying a portion of the direct voltage from this detection to the gate of the field effect transistor through the coupling resistor.

5 Claims, 2 Drawing Figures

SELF-BIASING FOR ENHANCEMENT-MODE FIELD EFFECT TRANSISTORS

The present invention relates to self-biasing for voltage amplifier devices derived from their input signal voltages and, more particularly to such biasing of enhancement-mode field effect transistors (FET's)

BACKGROUND OF THE INVENTION

Grid-leak biasing is a technique involved in vacuum tube electronics for biasing the signal applied to the signal grid, by superposing the signal on a direct voltage derived from the signal itself. The direct voltage for biasing the grid is developed by peaks of an input signal, which is resistance-coupled to the grid, being clamped by grid current conduction, as the grid-to-cathode rectifier is forward biased. This charges the dc-blocking capacitor in the resistance coupling network, operating it as a dc restoration capacitor to apply reverse bias to the vacuum tube between signal peaks. Grid-leak biasing is a form of self-biasing usually used to bias a low- or moderate-transconductance device into a linear operating region.

Self-biasing can be effective with a voltage-controlled device, since its essentially open-circuit input impedance does not demand such high discharge current from the dc-blocking capacitor as to cause severe droop in the dc restoration. Self-biasing is generally not employed with a current-controlled device, because it usually has a relatively low input impedance at its input electrode. This low impedance tends to discharge the dc-blocking capacitor too rapidly. Self-biasing as known in the prior art requires a depletion-mode operation characteristic in the device. So, self-biasing is not employed with bipolar transistors.

Self-biasing can be used with a junction-gate field effect transistor, which like a vacuum tube is invariably a depletion-mode device. Self-biasing can be achieved with insulated gate field effect transistors of depletion-mode type, even though they do not have gate-to-source rectifiers, by connecting separate rectifier devices between their gate and source electrodes.

Enhancement-mode insulated-gate field effect transistors require forward static bias potential, rather than reverse static bias potential, applied between source and gate electrodes to place them in their linear amplification regions. So one's natural inclination is to regard them as unsuitable amplifier devices for self biasing. It would be even more desirable to develop, forward self bias in an enhancement mode amplifier device than reverse self bias in a depletion mode amplifier device. With such self bias the enhancement-mode amplifier device would consume no more quiescent power than necessary for amplifying an input signal. As the input signal swing increases on average, self bias would further forward bias the amplifier device input circuit to avoid excessive clipping; but as the input signal swing decreases on average the amplifier device input circuit would be less forward biased, to reduce quiescent consumption in the device.

SUMMARY OF THE INVENTION

An input signal to be amplified is rectified to develop a direct potential of a polarity to forward bias the gate electrode field-effect transistor amplifier respective to its source electrode. The input signal is resistively coupled to the source/gate input circuit of the amplifier, for superposing it on the direct bias potential.

DETAILED DESCRIPTION

Figure 1:
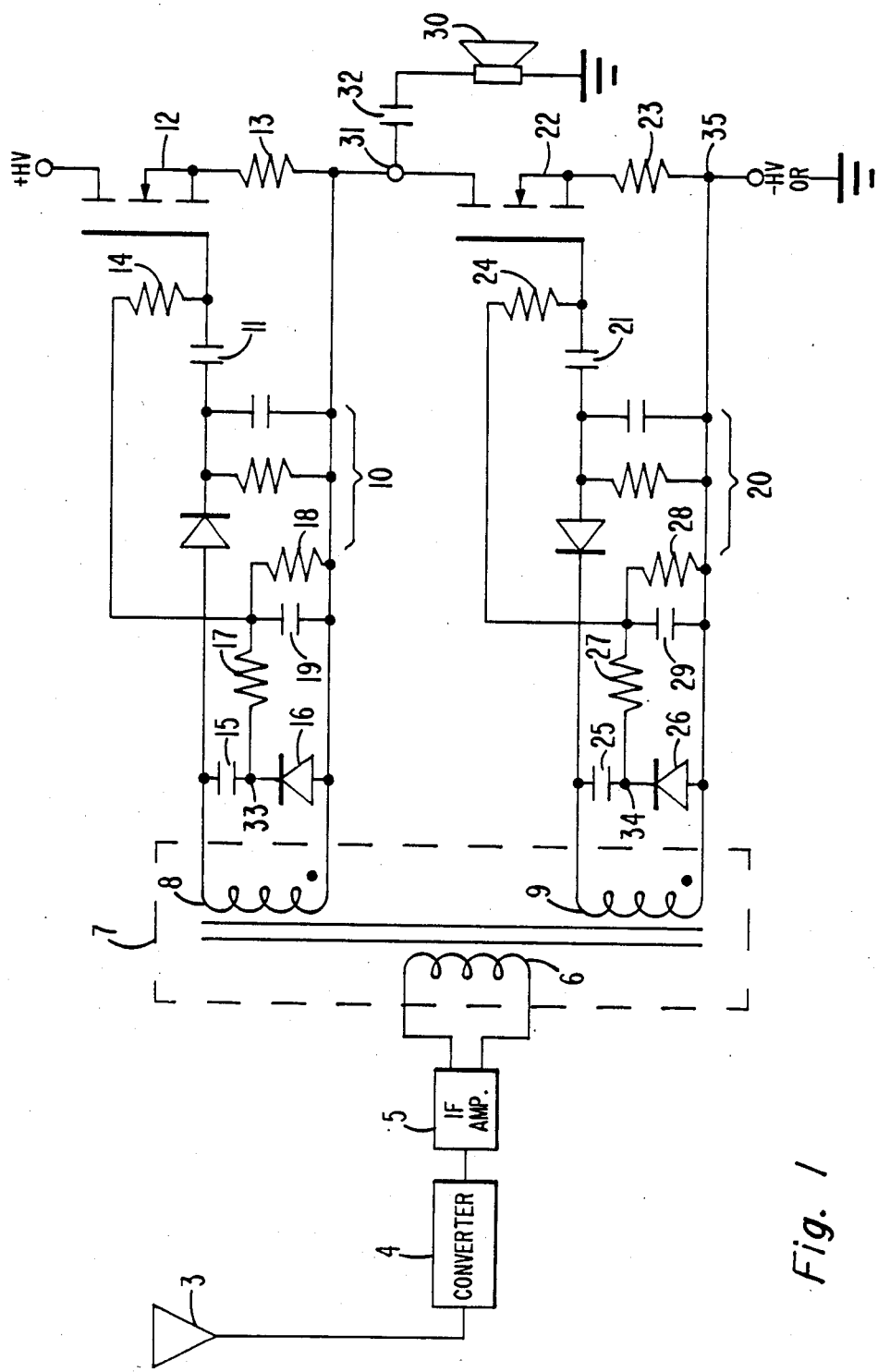
FIG. 1 is a schematic diagram of a simple amplitude-modulation radio receiver employing the present invention.

In the FIG. 1 AM radio receiver antenna 3 supplies radio-frequency signals to a converter 4, which is conventionally super-heterodyne type including a tunable local oscillator and mixer. A tuned-radio-frequency amplifier may precede converter 4, if desired. Converter 4 responds to selected radio-frequency signal to supply intermediate-frequency amplifier 5. Amplifier 5 supplies amplified signals to the primary winding 6 of an intermediate-frequency transformer 7 having a pair of secondary windings 8, 9, preferably bifilar-wound.

The positive envelope of the amplitude-modulated i-f voltage appearing across winding 8 is detected by an envelope detector 10, and the detected signal is applied via dc-blocking capacitor 11 to the gate electrode of an n-channel enhancement-mode field effect transistor 12. The negative envelope of the amplitude-modulated i-f voltage appearing across winding 9 is detected by an envelope detector 20, and the detected signal is applied via dc-blocking capacitor 21 to the gate electrode of an n-channel enhancement mode field effect transistor 22. That is, the gate drives to FET's 12 and 22 are antiphase respective to each other. Envelope detector 10 is resistively coupled to FET 12 with resistor 14 serving as coupling resistor; and envelope detector 20 is resistively coupled to FET 22 with resistor 24 serving as coupling resistor.

FET's 12 and 22 are connected in single-ended push-pull to serve as an audio power amplifier for supplying audio-frequency power to a loudspeaker 30 (or other load) via a power amplifier output terminal 31 and dc-blocking capacitor 32. FET 12 has its drain electrode connected to a positive operating potential +HV and has its source electrode connected through a linearizing source-degeneration resistor 13 to terminal 31. FET 22 has its drain electrode connected to terminal 31 and has its source electrode connected through a source degeneration resistor 23 to a node 35. Node 35 connects either to ground or to a negative operating potential, −HV.

It is preferable to bias FET's 12 and 22 for Class $AB_1$ operation, so that only the cross-over and positive portions of the detected envelopes applied to their gate electrodes exceed their threshold voltages. Of particular interest with regard to the invention is how one can develop the voltages to provide that biasing to the gate electrodes of FET's via coupling resistors 14 and 24.

The peak-to-peak amplitude of the amplitude-modulated i-f signal on winding 8 passes through dc-blocking capacitor 15. Diode 16 clamps the negative peaks of that signal to charge capacitor 15 and superpose the envelope on a direct voltage pedestal at node 33 that is positive respective to terminal 31. This voltage is divided by resistive potential divider action between resistors 17 and 18, is filtered to remove envelope variations by the RC low-pass filter resistors 17 and 18 from with a shunt capacitor 19, and is applied to the gate electrode of FET 12 via coupling resistor 14. The voltage division ratio of resistors 17 and 18 is chosen to bias FET 12 just above threshold voltage for zero modulation conditions.

Similarly, the peak-to-peak amplitude of the amplitude-modulated i-f signal on winding 9 passes through dc-blocking capacitor 25. Diode 26 clamps the negative peaks of that signal to charge capacitor 25 and superpose the envelope on a direct voltage pedestal at node 34 that is positive respective to node 35. This voltage is divided by resistive potential divider action between resistors 27 and 28, is filtered to remove envelope variations by the RC low-pass filter resistors 27 and 28 form with a shunt capacitor 29, and is applied to the gate electrodes of FET 22 via coupling resistor 24. The voltage division ratio of resistors 27 and 28 is chosen to bias FET 22 to just above threshold voltage for zero modulation conditions.

Resistors 18 and 28 may be dispensed with and envelope detectors 10 and 20 may be fed from taps on a windings 8 and 9, if its is desired to operated FET's 12 and 22 Class A to avoid cross-over distortion.

A power amplifier may be constructed replacing elements 3, 4 and 5 in FIG. 1 with a pre-amplifier, an oscillator and an amplitude modulator for modulating the pre-amplifier output onto the oscillations generated by the oscillator. The amplitude-modulated signal thus formed is applied to the primary winding of transformer 7. Transformer 7 has much smaller magnetic structure than an audio-frequency transformer, particularly if low audio frequencies are to be preserved at power amplifier output terminal 31. The amplitude of the oscillations prior to modulation can be varied in inverse proportion to the temperature of field effect transistors 12 and 22 to cause bias voltage to track threshold voltage variation with change in temperature.

Figure 2:
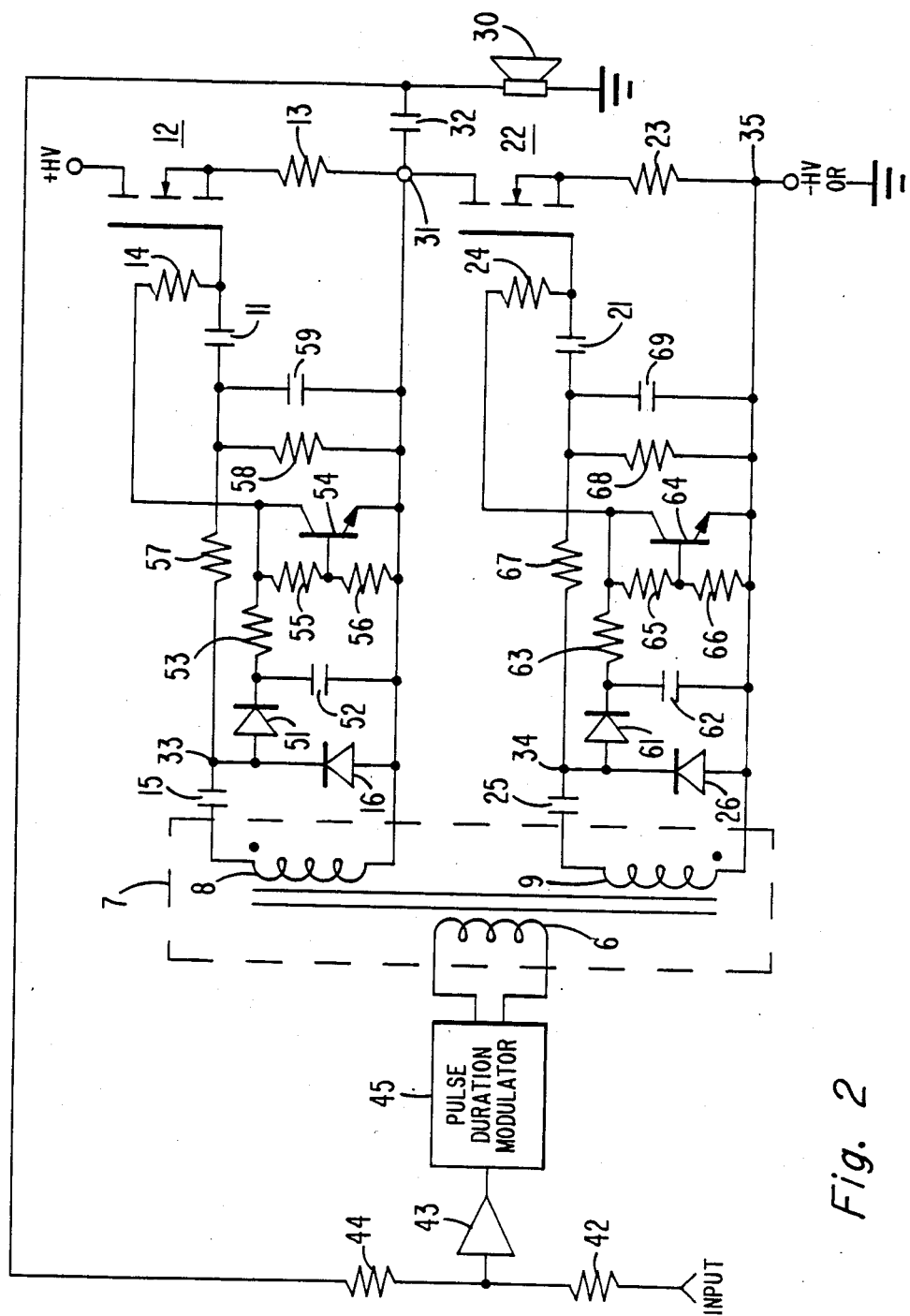
FIG. 2 is a schematic diagram of a power amplifier embodying the invention.

FIG. 2 shows an audio-frequency (a-f) power amplifier that uses pulse duration modulation (PDM), rather than amplitude modulation (AM), of the carrier signal applied to primary winding 6 of coupling transformer 7. Input signal is applied via resistor 42 to an input connection of a pre-amplifier 43, to which overall voltage feedback is also applied via resistor 44. The a-f signal from pre-amplifier 43 is supplied to pulse duration modulator 45 to modulate the duration or width of pulses supplied to primary winding 6 of transformer 7.

The peak-to-peak value of the PDM signal across secondary winding 8 is detected by elements 15, 16, 51, 52 in voltage-doubler configuration. The detected voltage is supplied to a regulator comprising elements 53–56. The emitter-base voltage of NPN transistor 54 is scaled up by collector-to-base feedback to be applied as temperature-compensated gate bias voltage to FET 12 via coupling resistor 14. The scaling factor is substantially equal to the ratio of resistor 55 resistance to resistor 56 resistance.

The peak-to-peak value of the PDM signal across secondary winding 8 is detected by elements 25, 26, 61, 62 in voltage-doubler configuration. This detected voltage is supplied to a regulator comprising elements 63–66 for applying temperature-compensated gate bias voltage to FET 22 via coupling resistor 24.

The clamped pulses at nodes 33 and 34 increase and decrease their widths in anti-phase. The pulses at node 33 are scaled down by voltage divider action between resistors 57 and 58, and their a-f content is detected by the RC low-pass filter formed by resistors 57 and 58 and a shunt capacitor 59. The detected a-f content of the pulses at node 33 is applied to the gate electrode of FET 12 via dc-blocking capacitor 11. The pulses at node 34 are scaled down by voltage divider action between resistors 67 and 68, and their a-f content is detected by the RC low-pass filter formed by resistors 67 and 68 and a shunt capacitor 69. The detected a-f content of the pulses at node 34 is anti-phase to that of the pulses at node 33 and is supplied to the gate electrode of FET 22 via dc-blocking capacitor 21.

An important advantage of the self bias technique taught above, particularly in single-ended push-pull power amplifier configurations as shown in FIGS. 1 and 2, is that change in the operating voltage applied to the channel of the enhancement mode transistor is not automatically accompanied by an undesirable change in source-to-gate bias.

What is claimed is:

1. Apparatus for self-biasing a field effect transistor comprising:

a source of input signal voltage between first and second nodes, to which first node the source electrode of said field effect transistor connects;

a dc-blocking capacitor;

a coupling resistor having a first end connected to the gate electrode of said field effect transistor and having a second end;

means for applying at least a portion of said input signal across said coupling resistor via said dc-blocking capacitor;

means for detecting the direct voltage amplitude of said input signal; and means for applying at least a portion of said direct voltage amplitude between the source electrode of said field effect transistor and the second end of said coupling resistor, thereby causing forward operating bias voltage to appear between the source and gate electrodes of said field effect transistor.

2. Apparatus for self-biasing a field effect transistor comprising:

a source of input signal voltage between first and second nodes, to which first node the source electrode of said field effect transistor connects;

a dc-blocking capacitor;

a coupling resistor having a first end connected to the gate electrode of said field effect transistor and having a second end;

means for applying at least a portion of said input signal across said coupling resistor via said dc-blocking capacitor;

means for detecting the direct voltage amplitude of said input signal;

means for applying at least a portion of said direct voltage amplitude between the source electrode of said field effect transistor and the second end of said coupling resistor, thereby applying forward operating bias between the source and gate electrodes of said field effect transistor; and an envelope detector included in said means for applying at least a portion of said input signal across said coupling resistor, said envelope detector having an input connection to said second node, a common connection to said first node, and an output connection connected through said dc-blocking capacitor for applying at least a portion of the output signal of said envelope detector across said coupling resistor.

3. A power amplifier stage comprising:

first and second operating voltage terminals;

an output terminal;

an input transformer having a primary winding to which input signals are applied, having a first secondary winding with respective first and second ends, and having a second secondary winding with respective first and second ends, the first end of said first secondary winding connected to said output terminal, and the first end of said second secondary winding connected to said second operating voltage terminal;

a first enhancement-mode field effect transistor, having drain and source electrodes respectively connected to said first operating voltage terminal and to said output terminal, and having a gate electrode;

a second enhancement-mode field effect transistor, having drain and source electrodes respectively connected to said output terminal and to said second operating voltage terminal, and having a gate electrode;

a first coupling resistor having a first end connected to the gate electrode of said first field effect transistor and having a second end;

means for detecting the peak amplitude of voltage at the second end of said first secondary winding;

means for applying, to the second end of said first coupling resistor, at least a portion of said detected peak amplitude of voltage at the second end of said first secondary winding, as gate bias voltage for said first field effect transistor;

a first dc-blocking capacitor, having a first plate connected to the gate electrode of said first field effect transistor, and having a second plate;

means for applying signal voltage to the second plate of said first dc-blocking capacitor responsive to the signal voltage appearing at the second end of said first secondary winding;

a second coupling resistor having a first end connected to the gate electrode of said second field effect transistor and having a second end;

means for detecting the peak amplitude of voltage at the second end of said second secondary winding;

means for applying, to the second end of said second coupling resistor, at least a portion of said detected peak amplitude of the voltage at the second end of said second secondary winding, as gate bias voltage for said second field effect transistor;

a second dc-blocking capacitor, having a first plate connected to the gate electrode of said second field effect transistor, and having a second plate; and means for applying signal voltage to the second plate of said second dc-blocking capacitor responsive to the signal voltage appearing at the second end of said second secondary winding.

4. A power amplifier stage comprising:

first and second operating voltage terminals;

an output terminal;

an input transformer having a primary winding to which input signals are applied, having a first secondary winding with respective first and second ends, and having a second secondary winding with respective first and second ends, the first end of said first secondary winding connected to said output terminal, and the first end of said second secondary winding connected to said second operating voltage terminal;

a first enhancement-mode field effect transistor, having drain and source electrodes respectively connected to said first operating voltage terminal and to said output terminal, and having a gate electrode;

a second enhancement-mode field effect transistor, having drain and source electrodes respectively connected to said output terminal and to said second operating voltage terminal, and having a gate electrode;

a first coupling resistor having a first end connected to the gate electrode of said first field effect transistor and having a second end;

means for detecting the peak-to-peak amplitude of voltage at the second end of said first secondary winding;

means for applying, to the second end of said first coupling resistor, at least a portion of said detected peak-to-peak amplitude of voltage at the second end of said first secondary winding, as gate bias voltage for said first field effect transistor;

a first dc-blocking capacitor, having a first plate connected to the gate electrode of said first field effect transistor, and having a second plate;

means for applying signal voltage to the second plate of said first dc-blocking capacitor responsive to the signal voltage appearing at the second end of said first secondary winding;

a second coupling resistor having a first end connected to the gate electrode of said second field effect transistor and having a second end;

means for detecting the peak-to-peak amplitude of voltage at the second end of said second secondary winding;

means for applying, to the second end of said second coupling resistor, at least a portion of said detected peak-to-peak amplitude of the voltage at the second end of said second secondary winding, as gate bias voltage for said second field effect transistor;

a second dc-blocking capacitor, having a first plate connected to the gate electrode of said second field effect transistor, and having a second plate; and means for applying signal voltage to the second plate of said second dc-blocking capacitor responsive to the signal voltage appearing at the second end of said second secondary winding.

5. In combination, a field effect transistor of enhancement mode type and apparatus for self-biasing said field effect transistor, which apparatus comprises:

a source of input signal voltage between first and second nodes, to which first node the source electrode of said field effect transistor connects;

a dc-blocking capacitor;

a coupling resistor having a first end connected to the gate electrode of said field effect transistor and having a second end;

means for applying at least a portion of said input signal across said coupling resistor via said dc-blocking capacitor;

means for detecting the direct voltage amplitude of said input signal; and means for applying at least a portion of said direct voltage amplitude between the source electrode of said field effect transistor and the second end of said coupling resistor, thereby causing forward operating bias voltage to appear between the source and gate electrodes of said field effect transistor.

* * * * *